US010359210B2

(12) United States Patent
Dawson et al.

(10) Patent No.: US 10,359,210 B2
(45) Date of Patent: Jul. 23, 2019

(54) APPARATUS TO REDIRECT AND/OR REDUCE AIRFLOW USING ACTUATORS

(71) Applicant: INTERNATIONAL BUSINESS MACHINES CORPORATION, Armonk, NY (US)

(72) Inventors: Christopher J. Dawson, Arlington, VA (US); Vincenzo V. Diluoffo, Sandy Hook, CT (US); Rick A. Hamilton, II, Charlottesville, VA (US); Michael D. Kendzierski, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/516,792

(22) Filed: Oct. 17, 2014

(65) Prior Publication Data
US 2015/0038069 A1 Feb. 5, 2015

Related U.S. Application Data

(63) Continuation of application No. 13/688,744, filed on Nov. 29, 2012, now Pat. No. 8,900,040, which is a
(Continued)

(51) Int. Cl.
*F24F 13/02* (2006.01)
*F24F 13/10* (2006.01)
(Continued)

(52) U.S. Cl.
CPC ............ *F24F 13/0227* (2013.01); *F16L 3/01* (2013.01); *F24F 7/10* (2013.01); *F24F 13/10* (2013.01);
(Continued)

(58) Field of Classification Search
CPC ... F24F 13/0227; F24F 13/10; H05K 7/20709
See application file for complete search history.

(56) References Cited

U.S. PATENT DOCUMENTS

| 421,017 | A | * | 2/1890 | Stein | ...................... B01D 45/08 55/423 |
| 1,586,010 | A | | 5/1926 | Augustine | |

(Continued)

OTHER PUBLICATIONS

Definition of "Manifold", Collins English Dictionary, HarperCollins Publishers, 2000.*
(Continued)

*Primary Examiner* — Kenneth Rinehart
*Assistant Examiner* — Phillip Decker
(74) *Attorney, Agent, or Firm* — Isaac Gooshaw; Andrew M. Calderon; Roberts Mlotkowski Safran Cole & Calderon, P.C.

(57) ABSTRACT

The invention generally relates to ventilation systems and methods, and more particularly to selectively configurable climate control systems and methods for use in data centers and the like. A device includes a support element in the form of a tile, and a plurality of ducts connected to the support element. The device also includes a manifold in fluid communication with each one of the plurality of ducts and a plurality of valves. Each respective one of the plurality of valves is associated with a respective one of the plurality of ducts. Moreover, there is at least one actuator operatively connected to the plurality of valves, which is structured and arranged to individually actuate each one of the plurality of valves.

20 Claims, 9 Drawing Sheets

Related U.S. Application Data continuation of application No. 12/135,234, filed on Jun. 9, 2008, now Pat. No. 8,382,565.

(51) Int. Cl.
*H05K 7/20* (2006.01)
*F24F 7/10* (2006.01)
*F16L 3/01* (2006.01)
*H01L 23/467* (2006.01)

(52) U.S. Cl.
CPC ..... *H05K 7/20709* (2013.01); *H05K 7/20745* (2013.01); *H05K 7/20836* (2013.01); *H01L 23/467* (2013.01); *H01L 2924/0002* (2013.01); *Y10T 137/4857* (2015.04)

(56) References Cited

U.S. PATENT DOCUMENTS

| | | | |
|---|---|---|---|
| 1,917,310 A * | 7/1933 | Lesage | F02M 35/022 55/391 |
| 2,751,198 A | 6/1956 | Rapp | |
| 2,761,462 A | 9/1956 | Snyder | |
| 2,807,809 A | 10/1957 | Kottemann | |
| 2,971,747 A | 2/1961 | Young | |
| 3,103,233 A | 9/1963 | Wulf | |
| 3,236,254 A * | 2/1966 | Venuti | E04B 9/02 454/232 |
| 3,259,050 A | 7/1966 | Grimm, III | |
| 3,318,225 A * | 5/1967 | May | F24F 11/04 454/267 |
| 3,516,347 A | 6/1970 | May | |
| 3,690,243 A | 9/1972 | Lambert | |
| 3,747,671 A | 7/1973 | Schwitzer, III | |
| 3,757,666 A | 9/1973 | Lambert | |
| 3,835,606 A | 9/1974 | Liberman | |
| 3,915,377 A | 10/1975 | Sutton | |
| 3,986,850 A | 10/1976 | Wilcox | |
| 4,047,473 A * | 9/1977 | Fletcher | B21D 51/46 493/108 |
| 4,084,389 A | 4/1978 | Meckler | |
| 4,091,840 A | 5/1978 | Grove et al. | |
| 4,211,281 A * | 7/1980 | Lawson | E21B 43/013 137/236.1 |
| 4,284,103 A | 8/1981 | Pemberton | |
| 4,315,412 A | 2/1982 | Meckler | |
| 4,406,397 A | 9/1983 | Kamata et al. | |
| 4,446,774 A | 5/1984 | Meckler | |
| 4,471,754 A * | 9/1984 | Galtz | B60H 1/2212 126/110 B |
| 4,531,454 A * | 7/1985 | Spoormaker | F24F 13/06 454/232 |
| 4,553,696 A | 11/1985 | Ichikawa et al. | |
| 4,646,500 A | 3/1987 | Smith | |
| 4,783,943 A | 11/1988 | Ljitngkvist | |
| 4,953,450 A | 9/1990 | Remondino | |
| 4,969,508 A | 11/1990 | Tate et al. | |
| 4,996,810 A | 3/1991 | Forde | |
| 5,107,687 A | 4/1992 | Candeloro | |
| 5,120,158 A * | 6/1992 | Husu | A01G 25/06 405/131 |
| 5,161,608 A * | 11/1992 | Osheroff | 165/208 |
| 5,167,575 A | 12/1992 | MacDonald | |
| 5,259,558 A | 11/1993 | Smith et al. | |
| 5,263,289 A | 11/1993 | Boyd | |
| 5,282,770 A | 2/1994 | Shibata | |
| 5,328,152 A | 7/1994 | Castle | |
| 5,345,779 A | 9/1994 | Feeney | |
| 5,370,578 A | 12/1994 | Yi | |
| 5,373,987 A | 12/1994 | Corabatir | |
| 5,381,902 A * | 1/1995 | Dumser et al. | 206/523 |
| 5,467,607 A | 11/1995 | Harvey | |
| 5,467,609 A | 11/1995 | Feeney | |
| 5,467,919 A | 11/1995 | Tamblyn | |
| 5,531,275 A * | 7/1996 | Sundholm | A62C 31/05 137/504 |
| 5,674,066 A * | 10/1997 | Hausermann | F23C 7/002 431/173 |
| 5,906,223 A * | 5/1999 | Pinkham | F16K 11/22 137/597 |
| 5,964,410 A | 10/1999 | Brown et al. | |
| 5,992,108 A | 11/1999 | Falcey | |
| 6,033,301 A | 3/2000 | Suwa | |
| 6,085,780 A | 7/2000 | Morris | |
| 6,099,406 A | 8/2000 | Demster | |
| 6,109,049 A * | 8/2000 | Wetherell | F24F 3/044 454/253 |
| 6,220,387 B1 * | 4/2001 | Hoppes | F01N 1/14 181/227 |
| 6,264,712 B1 * | 7/2001 | Decker | B01D 45/08 55/445 |
| 6,386,281 B1 | 5/2002 | Ganesh et al. | |
| 6,557,624 B1 | 5/2003 | Stahl et al. | |
| 6,574,104 B2 | 6/2003 | Patel et al. | |
| 6,604,993 B1 | 8/2003 | Boniface | |
| 6,616,524 B2 * | 9/2003 | Storck, Jr. | F24F 7/06 454/186 |
| 6,629,886 B1 | 10/2003 | Estepp | |
| 6,694,759 B1 | 2/2004 | Bash et al. | |
| 6,698,219 B2 * | 3/2004 | Sekhar | F24F 3/0442 454/236 |
| 6,725,914 B2 | 4/2004 | Petterson | |
| 6,739,385 B2 | 5/2004 | Brenner et al. | |
| 6,747,872 B1 | 6/2004 | Patel et al. | |
| 6,854,284 B2 | 2/2005 | Bash et al. | |
| 6,862,179 B2 | 3/2005 | Beitelmal | |
| 6,868,683 B2 | 3/2005 | Bash et al. | |
| 6,881,142 B1 | 4/2005 | Nair | |
| 6,885,115 B2 | 4/2005 | Hatori | |
| 6,928,775 B2 * | 8/2005 | Banister | H02S 40/38 136/244 |
| 6,945,058 B2 | 9/2005 | Bash et al. | |
| 6,991,533 B2 | 1/2006 | Tsai et al. | |
| 7,162,884 B2 | 1/2007 | Alles | |
| 7,214,131 B2 | 5/2007 | Malone | |
| 7,222,494 B2 | 5/2007 | Peterson et al. | |
| 7,259,963 B2 | 8/2007 | Germagian | |
| 7,266,964 B2 | 9/2007 | Vogel | |
| 7,304,477 B2 | 12/2007 | Korujn | |
| 7,331,852 B2 | 2/2008 | Ezell et al. | |
| 7,347,058 B2 | 3/2008 | Malone et al. | |
| 7,364,094 B2 | 4/2008 | Bagwell et al. | |
| 7,432,472 B2 * | 10/2008 | Åkerlind | B44F 1/10 219/213 |
| 7,455,237 B2 | 11/2008 | Kates | |
| 7,568,360 B1 | 8/2009 | Bash et al. | |
| 7,632,324 B2 * | 12/2009 | Makarov | A47L 5/30 15/350 |
| 8,066,096 B1 * | 11/2011 | Francisco | B64D 33/02 181/214 |
| 8,251,784 B2 | 8/2012 | Dawson et al. | |
| 8,758,101 B2 * | 6/2014 | Khalitov | F04D 17/06 181/198 |
| 9,370,125 B2 * | 6/2016 | Abuelsaad | G05D 23/1934 |
| 9,761,416 B2 * | 9/2017 | Nguyen | H01J 37/32495 |
| 9,822,741 B2 * | 11/2017 | Holzmann | F02M 35/10137 |
| 2003/0213853 A1 | 11/2003 | Demster | |
| 2003/0224717 A1 | 12/2003 | Tsai et al. | |
| 2004/0264124 A1 | 12/2004 | Patel et al. | |
| 2005/0064812 A1 | 3/2005 | Darling | |
| 2005/0159099 A1 | 7/2005 | Malone | |
| 2005/0225936 A1 | 10/2005 | Day | |
| 2005/0258391 A1 | 11/2005 | Howe | |
| 2006/0015712 A1 | 1/2006 | Ang | |
| 2006/0015866 A1 | 1/2006 | Ang | |
| 2006/0021759 A1 * | 2/2006 | Golinveaux | A62C 35/60 169/17 |
| 2006/0073783 A1 | 4/2006 | Tsai et al. | |
| 2006/0076425 A1 | 4/2006 | Demster | |
| 2006/0086119 A1 | 4/2006 | Malone et al. | |
| 2006/0091229 A1 | 5/2006 | Bash et al. | |

(56) References Cited

U.S. PATENT DOCUMENTS

| | | | |
|---|---|---|---|
| 2006/0139877 A1* | 6/2006 | Germagian | H05K 7/20745 361/695 |
| 2006/0168975 A1 | 8/2006 | Malone et al. | |
| 2006/0186213 A1* | 8/2006 | Carey | F24F 3/0442 236/1 B |
| 2006/0199508 A1* | 9/2006 | Nair | F24F 11/0001 454/237 |
| 2006/0225446 A1 | 10/2006 | Bash et al. | |
| 2006/0234621 A1 | 10/2006 | Desrochers et al. | |
| 2006/0257254 A1* | 11/2006 | Ho | F04D 29/545 415/220 |
| 2006/0260338 A1 | 11/2006 | VanGilder | |
| 2007/0062685 A1 | 3/2007 | Patel | |
| 2007/0080689 A1 | 4/2007 | Konijn | |
| 2007/0082601 A1 | 4/2007 | Desrochers et al. | |
| 2007/0125107 A1 | 6/2007 | Beam | |
| 2007/0130850 A1 | 6/2007 | Miekka | |
| 2007/0146994 A1 | 6/2007 | Germagian | |
| 2007/0194142 A1 | 8/2007 | Sharma et al. | |
| 2007/0213000 A1 | 9/2007 | Day | |
| 2007/0238408 A1 | 10/2007 | Taylor | |
| 2008/0055850 A1 | 3/2008 | Carlson et al. | |
| 2008/0112155 A1 | 5/2008 | Scown et al. | |
| 2008/0319716 A1* | 12/2008 | Golinveaux | A62C 3/002 703/1 |
| 2009/0218078 A1 | 9/2009 | Brunschwiler et al. | |
| 2009/0302124 A1 | 12/2009 | Dawson et al. | |
| 2010/0318226 A1 | 12/2010 | Augusto et al. | |
| 2010/0326396 A1* | 12/2010 | Patel | B01D 46/527 123/198 E |
| 2016/0025362 A1* | 1/2016 | Martindale | F24F 11/0076 236/49.3 |

OTHER PUBLICATIONS

Wang, Handbook of Air Conditioning and Refrigeration, Second Edition, McGraw-Hill, 2001, Chapter 21.

Collins English Dictionary, Londong: Collins 2000, "manifold".

Dictionary of Engineering Terms, Butterworth-Heinemann, Oxford: Elsevier Science & Technology, 2001, "valves".

Siemens Building Technologies Helping Your Building Work for You website, Feb. 2, 2007, http:l/web.archive.org/web/20070202194530/ http://www.us.sbt.siemens.com/marketplaces/advantageservices.asp.

UltimateHoseNozzle.com website, Feb. 2, 2007, http://web.archive.org/web/20070202041354/http://www.ultimatehosenozzle.com/.

Alex Frangos; "Raised-Floor Vbntilation Gains Footing in Offices"; URL://http://www.realestatejoumal.com/propertyreport/office/20030714-frangos.html; pp. 1-2.

Kevin Epstein, et al.; "Double Jeopardy in a 'Slow' Disaster Computing Data Center Challenges in a f andemic World"; URL: http://www.scalent.com/html/company/News/drj_ spring07 .pdf?item=21900; Spring 12006; pp. 50-51.

Ron Anderson; Increased power and cooling requirements are creating intensified demand for data-center tredesigns; URL: http://i.cmpnet.com/v3 .businessinnovation.cmp.com/pdfs/nwca_datacenter_report.pdf ; Aug. 12006; pp. 1-24.

"Data Center Cooling, Server Room Cooling & Rack Cooling Solutions"; URL http://www.42u.com/42u-rack-cooling. htm; accessed Jun. 9, 2008, pp. 1-4.

"Flow Modeling Solutions for Data Centers"; URL http://www.fluent.com/solutions/data_centers/index.htm; accessed Jun. 9, 2008, p. 1.

* cited by examiner

APPARATUS TO REDIRECT AND/OR REDUCE AIRFLOW USING ACTUATORS

FIELD OF THE INVENTION

The invention generally relates to ventilation systems and methods, and more particularly to selectively configurable climate control systems and methods for use in data centers and the like.

BACKGROUND

A data center (or other physical space) beneficially has, where possible, an optimized heating and cooling infrastructure. Maintaining data centers at desired temperatures (e.g., set points) helps prevent computer hardware (e.g., IT infrastructure) from overheating and malfunctioning. To this end, many data centers are cooled to relatively low temperatures (e.g., 65° F.) to increase equipment reliability and useful life, and to avoid downtime for repair and/or replacement.

However, current climate control systems are largely inefficient. Data centers typically have hot spots where IT equipment operates. Conventional cooling systems cool the entire data center to a temperature well below the set point so that IT equipment operating in the hot spots does not exceed the set point. This increases operational costs and wastes energy.

More specifically, conventional climate control systems for data centers typically utilize static (i.e., fixed) ducts and vents/diffusers. Usually this is achieved through the use of multiple air conditioners, heaters, vents or blowers. In the current art, a centralized air conditioning or 'forced air' system requires the use of static conduits or ducts. These ducts are usually installed to blow hot or cold air from a centralized air conditioning or heating unit to specific areas of the building. One problem with this known solution is that these ducts cannot easily be changed or rerouted to accommodate changing conditions on a room. For example, ducts are usually embedded in the ceiling, walls, or floor, and therefore require time-consuming intervention to re-route.

Another problem with fixed systems is that they are highly inefficient. In data centers, the hot spots are routinely changing location depending on which IT equipment is running at any given time. For example, some IT infrastructure in a first area of the data center may run during the day, while other IT infrastructure at a different area of the datacenter operates at night. To accommodate such moving hot spot targets, existing systems resort to a sort of 'overkill' by cooling the entire volume of the data center to well below the set point, which increases operational costs. Moreover, with the increasing awareness and desire to operate in a green manner, such excessive use of energy is undesirable.

Distributed cooling systems represent an alternative or supplement to fixed-duct systems, in which individual local units (similar, for example, to a window air conditioning unit) are moved around within the data center depending on the localized cooling needs. However, these decentralized systems are expensive to manage and maintain. Moreover, there is a certain amount of time required to re-position local cooling units within a data center, such that decentralized systems cannot adapt quickly to changes in temperature of different areas in a room.

Accordingly, there exists a need in the art to overcome the deficiencies and limitations described hereinabove.

SUMMARY

In a first aspect of the invention, there is a device comprising a support element and a plurality of ducts connected to the support element. The device also includes a manifold in fluid communication with each one of the plurality of ducts and a plurality of valves. Each respective one of the plurality of valves is associated with a respective one of the plurality of ducts. Moreover, there is at least one actuator operatively connected to the plurality of valves, which is structured and arranged to individually actuate each one of the plurality of valves.

In another aspect of the invention, there is a system comprising a plurality of devices, each device comprising a support element, a plurality of ducts connected to the support element, and a manifold in fluid communication with each one of the plurality of ducts. Each device further includes a plurality of valves, each respective one of the plurality of valves being associated with a respective one of the plurality of ducts, and at least one actuator operatively connected to the plurality of valves, structured and arranged to individually actuate each one of the plurality of valves. One of the plurality of ducts of a first of the plurality of devices is operatively connected in fluid communication with one of the plurality of ducts of a second of the plurality of devices.

In another aspect of the invention, there is a method comprising providing a fluid to a lattice of interconnected ducts, actuating a first subset of a plurality of valves in the lattice to create a first flow path of the fluid through the lattice, and actuating a first subset of a plurality of nozzles along the first flow path to deliver the fluid to a first localized area of a room.

BRIEF DESCRIPTION OF SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to ventilation systems and methods, and more particularly to selectively configurable climate control systems and methods for use in data centers and the like. Embodiments of the invention include a structural element (e.g., a ceiling tile) comprising selectively openable (and closable) ducts and a selectively openable (and closable) nozzle. The ducts of adjacent tiles may be connected to one another, such that a plurality of tiles may be tessellated to create a lattice of ducts in a ceiling, wall, or floor of a room (e.g., datacenter). By selectively controlling actuators to open and close selected ones of the ducts and nozzles in a coordinated manner (e.g., via computer control), a targeted air delivery system may be provided. In this manner, implementations of the invention provide a highly efficient climate control system that is reconfigurable both quickly and inexpensively. Accordingly, embodiments of the invention may be used to implement a green data center that is economical to operate and reduces energy waste, while still maintaining computing infrastructure at desired operating temperatures.

Figure 1:
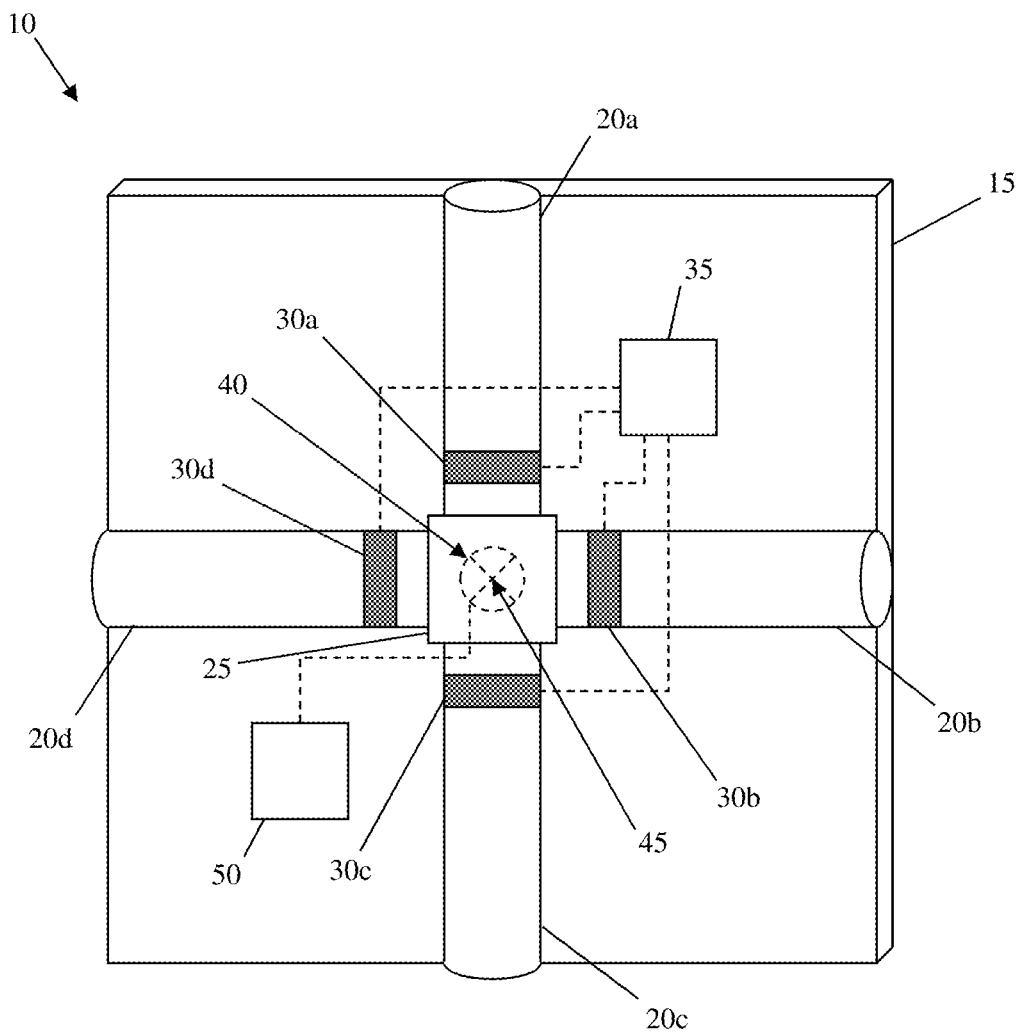
FIG. 1 shows a perspective top view of an exemplary structural element according to aspects of the invention.

FIG. 1 shows an exemplary structural element 10 according to aspects of the invention. Throughout this disclosure, the structural element 10 is referred to as a tile (e.g., tile 10); however, the invention is not limited in this regard, and the structural element may comprise any suitable element. Tile 10 comprises a support element 15, which may comprise, for example, a plate-like element of suitable size and shape. For example, the support element 15 may comprises a rectangular tile that is sized and shaped like a conventional ceiling tile, and composed of any conventional material (e.g., plasterboard, fiberglass, plywood, metal, plastic, compressed fiberboard, etc.).

Attached to the support element 15 is a plurality of ducts 20a, 20b, 20c, 20d. Although four ducts 20a-d are depicted, any number of ducts (generally referred to using reference number 20) may be used within the scope of the invention. The ducts 20a-d are structured and arranged to convey fluid (such as for example, cool air, hot air, etc.) and can be any desired size, shape, and material (e.g., plastic, aluminum, etc.). In implementations, the ducts 20a-d are insulated to reduce heat transfer through the duct walls. In further embodiments, a second support element (not shown) may be connected to the ducts 20a-d on a side of the ducts 20a-d generally opposite the support element 15, whereby the ducts 20a-d are sandwiched between the support element 15 and the second support element.

In embodiments, the ducts 20a-d are connected to one another via manifold 25. The manifold 25 may be any size and shape, and composed of any suitable material, as long as it is capable of putting all ducts 20a-d in fluid communication with each other. For example, if the tile 10 comprises four cylindrical (e.g., pipe, tube, etc.) ducts 20a-d, the manifold 25 may comprise a cube-like structure having four circular holes in different faces such that an end of each respective duct fits into or around one of the holes. The manifold may be connected to the support member 15 at any location on the support member 15, and is not limited to the central location depicted in FIG. 1.

Associated with each one of the ducts 20a-d is a respective valve 30a-d. The valves 30a-d may be located at any suitable location along the respective ducts 20a-d, including outside the manifold 25, inside the manifold 25, or at an interface of the duct and the manifold 25. The valves 30a-d can be any device capable of selectively allowing (e.g., in an open state) or substantially prohibiting (e.g., in a closed state) the flow of fluid within an associated duct 20a-d. For example, each one of the valves 30a-d may be, but is not limited to, a gate valve, butterfly valve, or iris valve.

According to aspects of the invention, at least one actuator 35 is operatively connected to the plurality of valves 30a-d in a manner such that each valve 30a-d may be individually controlled (e.g., opened or closed). The actuator 35 may comprise any suitable actuator (e.g., an electric servo motor) that is connected to the valves 30a-d by suitable structure (e.g., linkage, cam, etc.) for effectuating opening/closing of the valves. In particular embodiments, a single actuator 35 is used to control all of the valves 30a-d, such as, for example, an arrangement of cams on a rotatable shaft where each respective cam is linked to one of the valves 30a-d. In alternative embodiments, plural actuators 35 are used, such as, for example, one per valve. The at least one actuator 35 may be mounted at any desired location, such as, for example, on the support member 15, on or in the manifold 25, or on or in any of the ducts 20a-d.

Figure 2A:
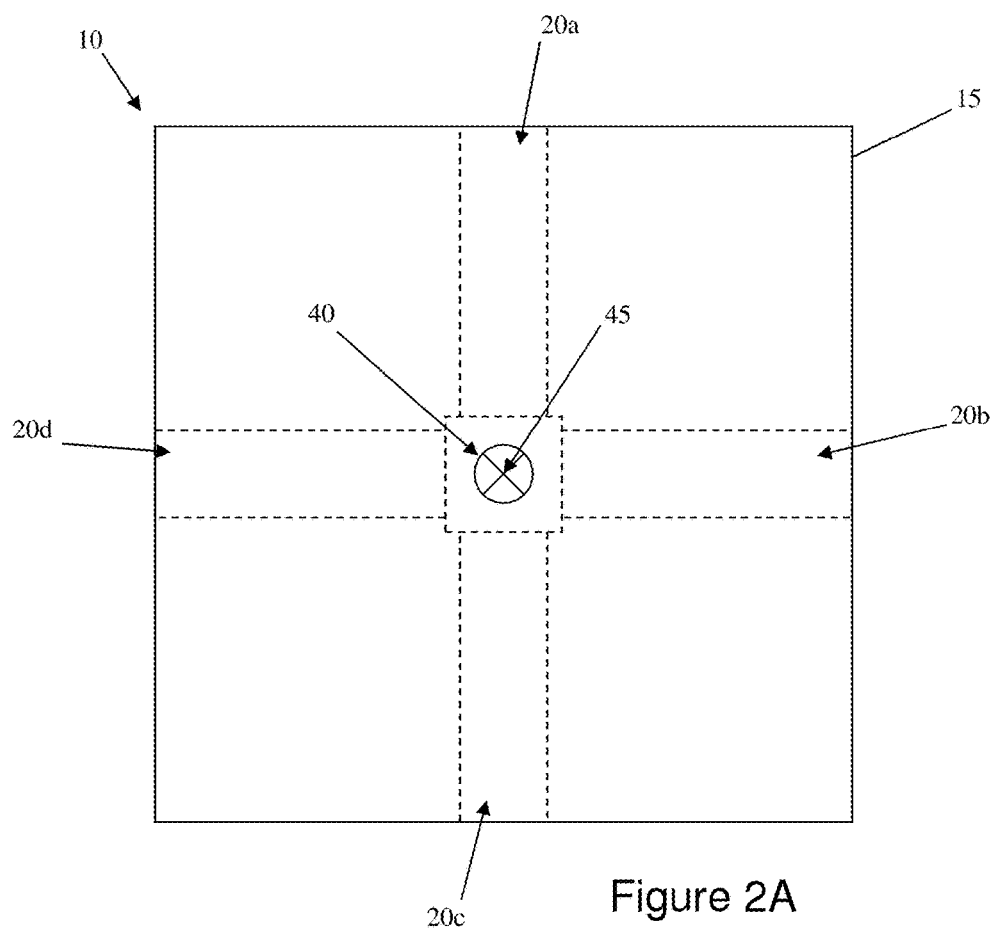
FIG. 2A shows a bottom view of the exemplary structural element according to aspects of the invention.

As seen in FIGS. 1 and 2A, in embodiments, the tile 10 further comprises a port 40 extending through the support member 15 and including a port valve 45, such that the interior of the manifold 25 can be selectively placed in fluid communication with the opposite side of the support member 15. Port valve actuator 50 controls opening and closing of the port valve 45, and may comprise, e.g., an electric servo motor. The port valve actuator 50 may be located on the top side of the support member 15, e.g., attached to at least one of the support member 15, the manifold 25, and a duct 20a-d.

Figure 2B:
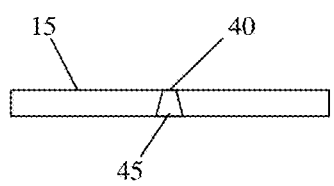
FIGS. 2B-2D show states of an adjustable nozzle according to aspects of the invention.
Figure 2C:
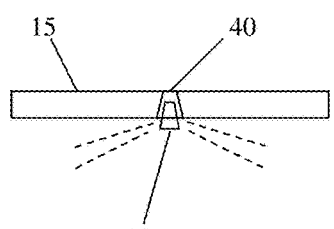
Figure 2D:
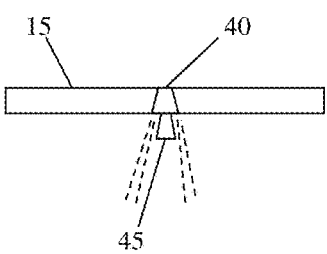

In particular embodiments, the port valve 45 comprises an adjustable shower-head type nozzle that can be changed between off (FIG. 2B), diffuse spray (FIG. 2C), and focused stream (FIG. 2D) states, although the invention is not limited to such a valve and any suitable valve may be used. By utilizing a shower-head type nozzle, the fluid provided by the tile 10 into the room (e.g., data center) can be directed as a focused stream or a diffuse spray.

Figure 3:
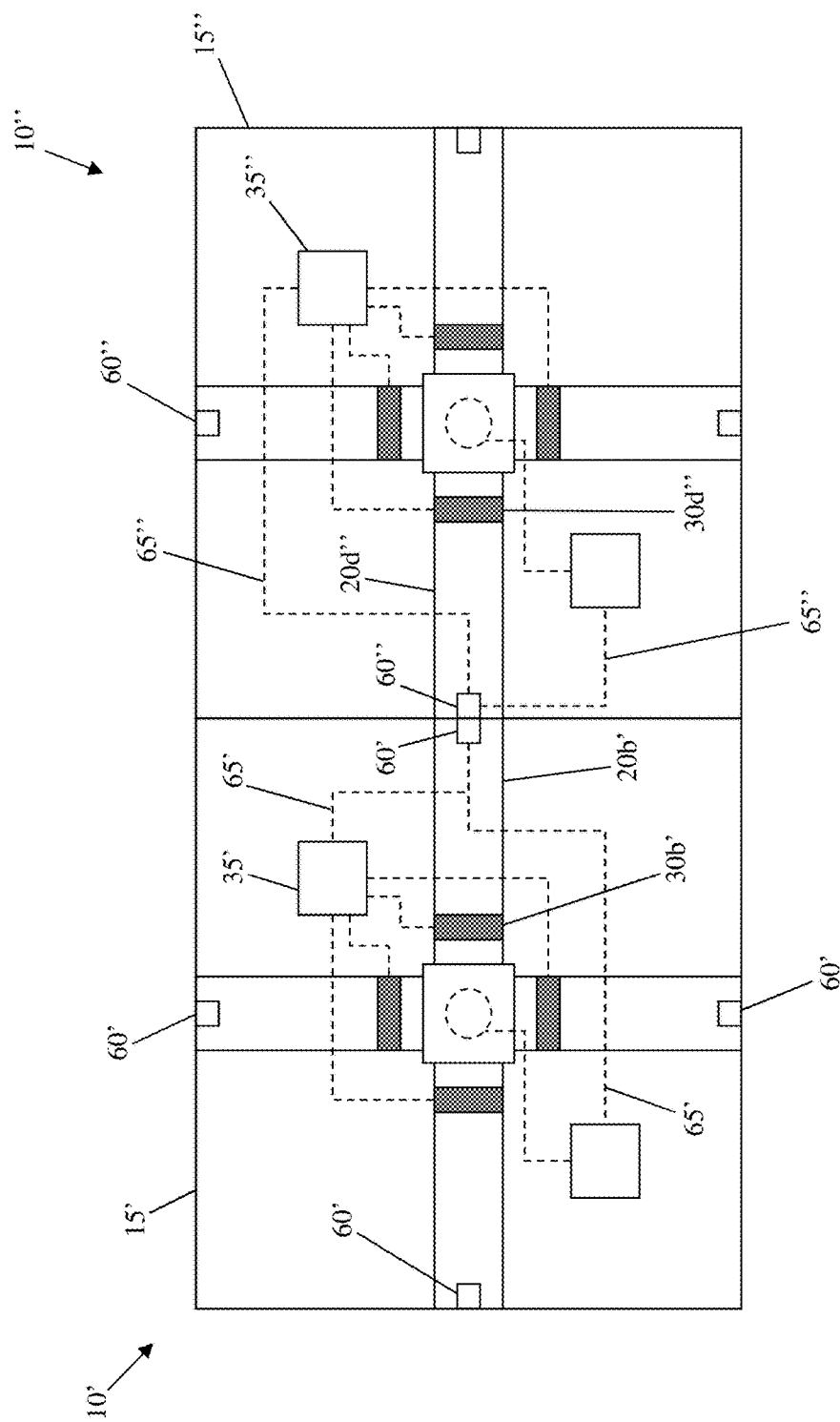
FIG. 3 shows a connection of two structural elements according to aspects of the invention.

FIG. 3 shows an exemplary connection of two tiles 10' and 10" according to aspects of the invention. The tiles 10' and 10" are similar to those described above with respect to FIGS. 1 and 2A-2D, however, for clarity, not all features are labeled and/or shown in FIG. 3. Tile 10' is shown with support member 15', duct 20b', valve 30b', and actuator 35', while tile 10" is shown with support member 15", duct 20d", valve 30d", and actuator 35".

The ducts 20b' and 20d" are connected end to end such that they are in fluid communication with each other. The connection between ducts 20b' and 20d" may be made in any suitable manner, including, but not limited to: male to female (e.g., a smaller duct extends inside a larger duct), inner sleeve, outer sleeve, flange to flange, etc.

Still referring to FIG. 3, in embodiments, each tile 10' and 10" includes at least one electrical connection 60' (e.g., on tile 10') and 60" (e.g., on tile 10"). The electrical connectors 60' and 60" provide electrical communication between the tiles 10' and 10", with conductive wires 65' and 65" extending between the respective connectors 60' and 60" and actuators 35' and 35" (and port valve actuators 50, if present). In this manner, electricity for powering the actuators 35' and 35" (and, possibly, control signals for controlling the actuators 35' and 35") is provided to each tile 10' and 10".

According to aspects of the invention, the connectors 60' and 60" are located anywhere on the respective tiles 10' and 10", such as, for example: on the exterior of the ducts 20b' and 20d", on the interior of the ducts 20b' and 20d", or on the support members 15' and 15". In particular embodiments, the connectors 60' and 60" are arranged (e.g., at the edges of tiles 10) such that the connectors 60' and 60" are engaged substantially automatically and simultaneously when the ducts 20b' and 20d" are placed in end to end contact. However, the invention is not limited to this embodiment, and alternatively the connectors 60' and 60" may be provided with enough free play (e.g., via length of wires 65' and 65") such that they can be manually connected after the ducts 20*b*' and 20*d*" are engaged. The connectors 60' and 60" may comprise any suitable electrical connection device, such as, for example, male and female plugs, wiring harnesses, etc.

Moreover, in embodiments, each duct 20*a*-*d* of each tile 10 has an electrical connector 60 and wire(s) 65 associated therewith. In this manner, electrical redundancy is provided when a plurality of tiles 10 are connected in an array.

Figure 4:
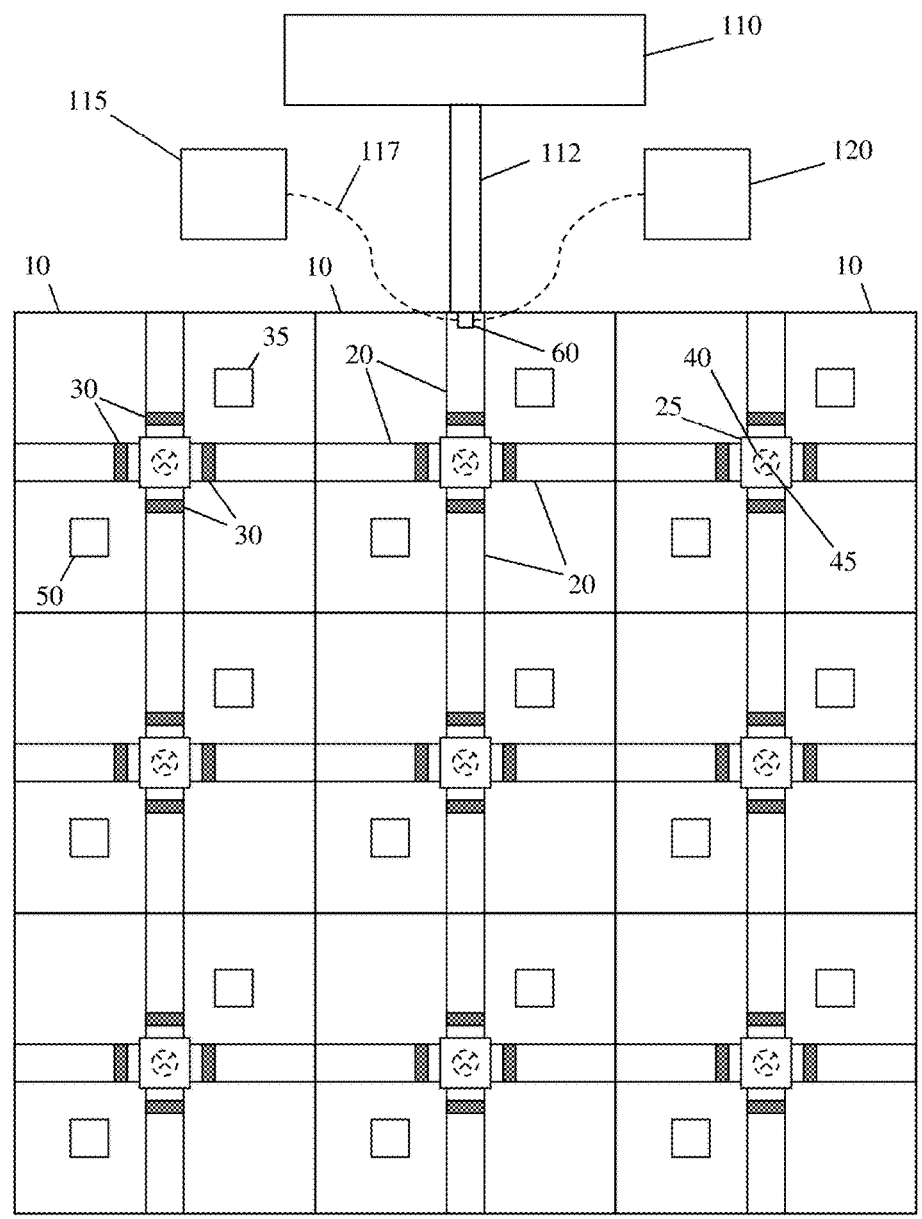
FIG. 4 shows a system including an array of structural elements according to aspects of the invention.

FIG. 4 shows an array of tiles 10 according to aspects of the invention. The tiles 10 may be similar to those already described thus far, whereby the ducts and valves are generally referred to using reference numbers 20 and 30, respectively. The array of tiles provides an array of ports 40 and port valves 45 for moving fluid to/from an adjacent space (e.g., data center). The ducts 20 of adjacent tiles 10 are connected in fluid communication (e.g., similar to described above with respect to FIG. 3). Moreover, adjacent tiles 10 are electrically connected to each other as described above with respect to FIG. 3.

At least one duct 20 of one tile 10 is connected to (e.g., in fluid communication with) a fluid source 110, such as, for example, an HVAC unit. The fluid source 110 may be connected to the duct 20 by any suitable plumbing 112 (e.g., ducting). Moreover, at least one tile 10 is electrically connected to a power supply 115 (e.g., an AC or DC power supply), via wire(s) 117 connected to an electrical connector 60 of at least one tile. In this manner, through selective control of the various actuators 35 and port valve actuators 50 of each tile 10, the valves 30 of each duct 20 of each tile 10 may be individually controlled to route fluid (e.g., air) from the fluid source 110 to any combination of tiles 10. The control may be provided, for example, by a controller 120 (such as, for example, a computing device described in greater detail below) that transmits control signals to the actuators 35 and port valve actuators 50, e.g., through wires 65 (e.g., via electrical connectors 60), or via wireless communication.

Figure 5:
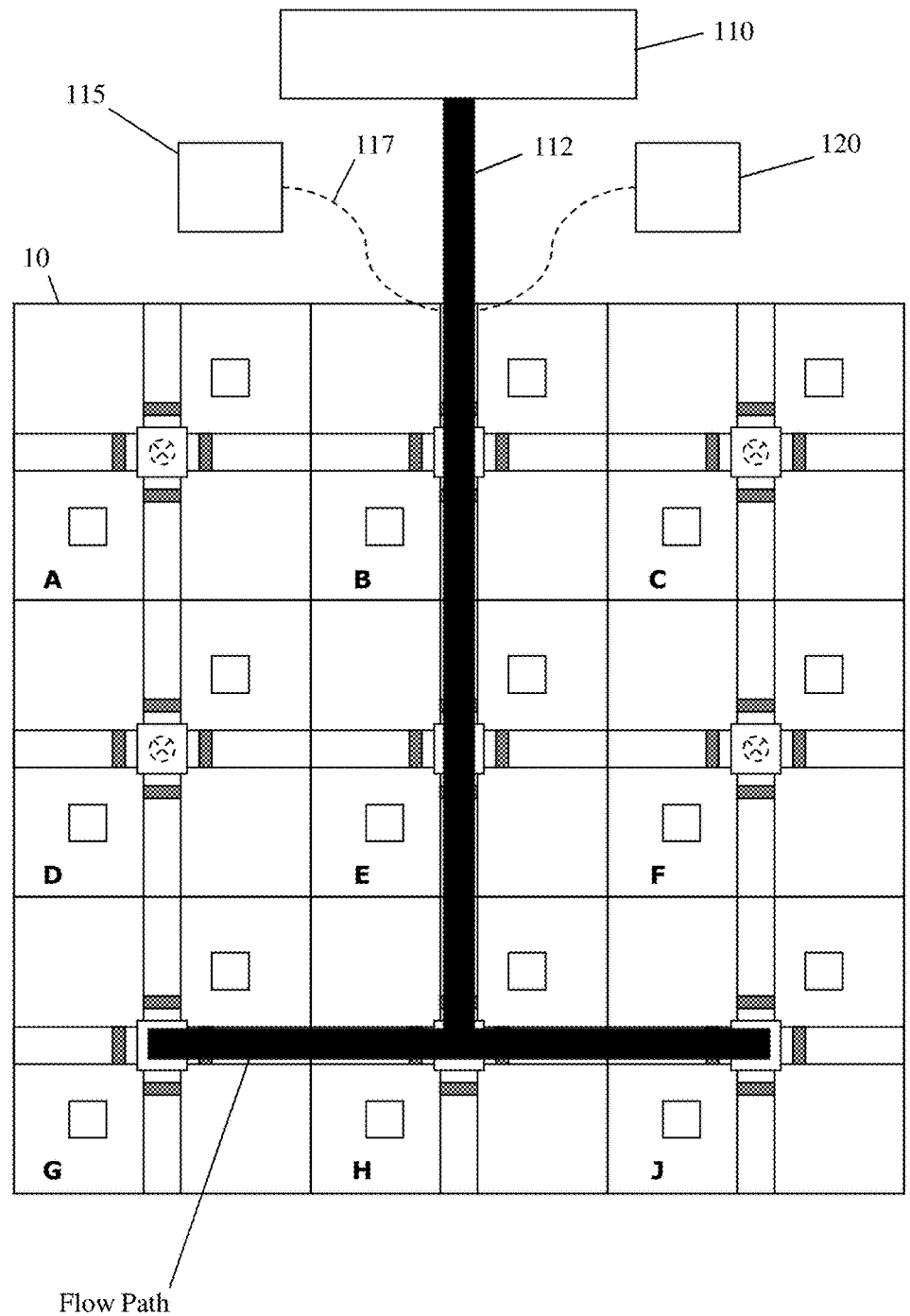
FIG. 5 shows a first mode of operation according to aspects of the invention.
Figure 6:
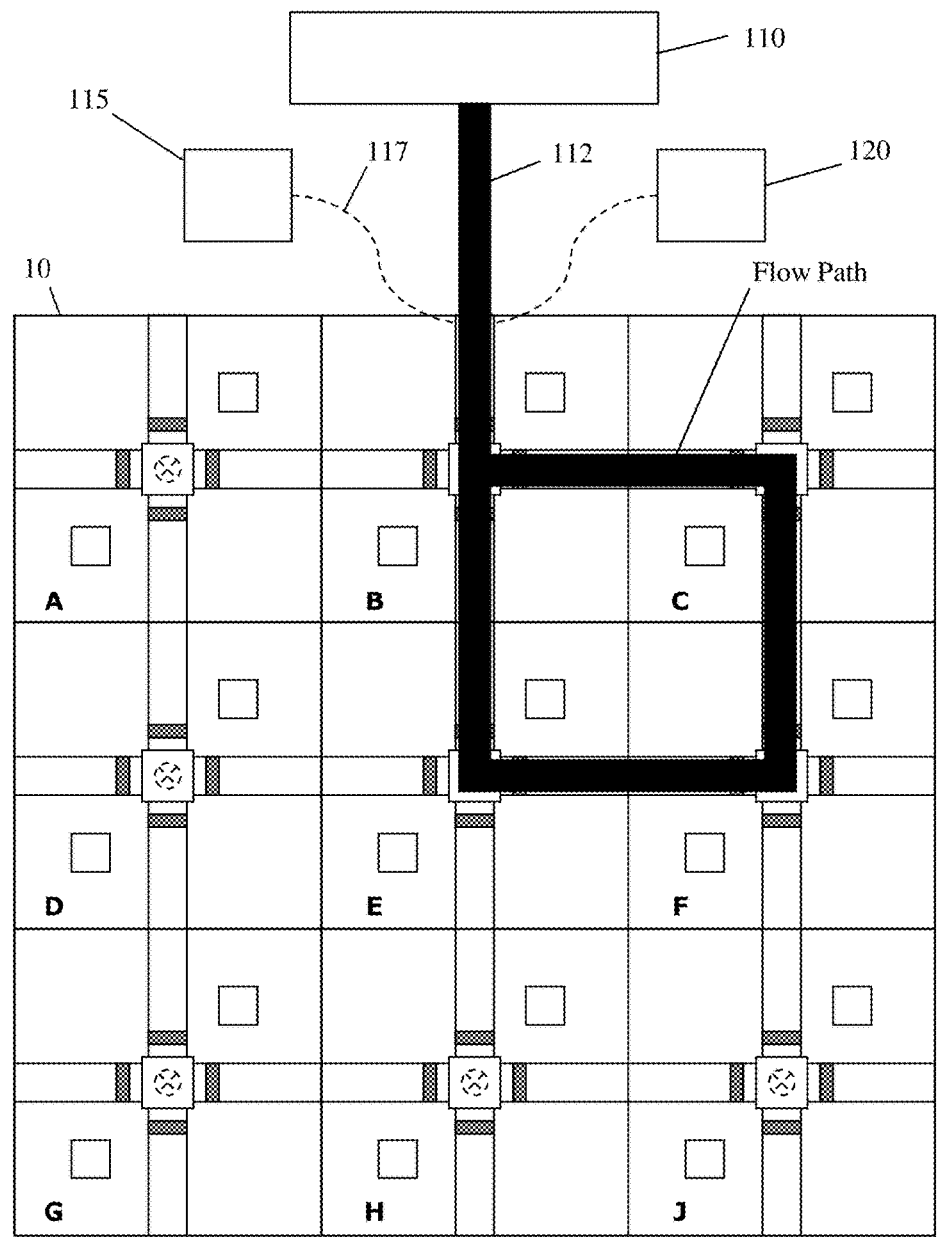
FIG. 6 shows a second mode of operation according to aspects of the invention.

FIGS. 5 and 6 show diagrammatic representations of different modes of operation of an array of tiles 10 comprising tiles labeled A through J. The array of tiles 10 may be similar to that described with respect to FIG. 4. As depicted in FIG. 5, during a first exemplary mode of operation, air is directed through tiles B, E, G, H, and J by selective opening and closing of individual valves 30. For example, the controller 120 may send signals to appropriate ones of the actuators 35 to cause a selective opening or closing of appropriate valves 30. Thus, the fluid from the fluid source 110 is routed along the flow path depicted by the thick line in FIG. 5, whereby tiles A, C, D, and F receive no air from the fluid source 110.

In addition to controlling the routing of the fluid amongst the tiles 10, the controller 120 may also be arranged to control the opening and closing of the various port valves 45 in the tiles 10. For example, in the mode shown in FIG. 5, the controller 120 sends an actuation signal to the port valve actuators 50 of tiles B and E to close their respective port valves 45, while also transmitting an actuation signal to the port valve actuators 50 of tiles G, H, and J to open their respective port valves 45. In this manner, fluid from fluid supply 110 is delivered in a targeted manner to the area of the room in the vicinity of tiles G, H, and J.

FIG. 6 shows a second exemplary mode of operation in which the cooling requirements (e.g., of the data center) have changed. Whereas cooling is required in the vicinity of tiles G, H, and J in the first mode (FIG. 5), cooling is required in the vicinity of tiles B, C, E, and F in the second mode (FIG. 6). Such a change in cooling requirements may be caused, for example, by IT equipment in different areas of the room turning off and on.

Accordingly, in the second mode, the controller 120 sends actuation signals to appropriate ones of the actuators 35 to cause appropriate valves 30 to open or close to create the flow path depicted by the thick line in FIG. 6. Moreover, the controller 120 sends actuation signals to the port valve actuators 50 of tiles B, C, E, and F to open the port valves 45 of these tiles, such that air from supply 110 is delivered in a targeted manner to the area of the room in the vicinity of tiles B, C, E, and F.

As can be seen from this example, implementations of the invention provide targeted climate control (e.g., cooling) that is quickly and easily adjusted to meet the changing needs of a data center. The invention is not limited to the two modes of operation described in FIGS. 5 and 6, but rather any suitable combination of flow path and port valve openings can be used within the scope of the invention. Moreover, although the arrangement of tiles 10 is shown to be square (e.g., three by three) any desired combination of tiles can be used to create any size and shape of array.

The controller 120 described above may be any suitable control device, such as a computing device, that is capable of transmitting actuation signals to each one of the respective actuators 35 and/or port valve actuators 50 in an array of tiles 10. In embodiments, each respective actuator 35 and port valve actuator 50 of an array of tiles 10 may be assigned a unique identifier (ID), such that individual control of each actuator 35 and port valve actuator 50 is possible. More specifically, each actuator 35 and port valve actuator 50 may be: provided with a predefined ID (e.g., similar to a MAC address); assigned an ID (e.g., similar to a static IP address) by a user via programming of the controller 120; or, automatically assigned an ID by the controller (e.g., similar to a plug-and-play dynamic IP address) by way of programming of the controller 120. By having a unique ID associated with each actuator 35 and port valve actuator 50, the controller 120 can be programmed to send appropriate actuation signals to each individual actuator 35 and port valve actuator 50 (via electrical connectors 60 and wires 65, or wirelessly) to achieve substantially any desired flow configuration of an array of tiles 10.

In further embodiments of the invention, more than one duct 20 may be provided in fluid communication with the fluid source 110. For example, a source manifold (not shown) may be used to connect the fluid source 110 to a plurality of ducts 20 of different tiles 10 of an array of tiles 10 to provide redundancy to the system. Additionally or alternatively, a first duct 20 of a first tile 10 may be connected to a first fluid source 110 (e.g., a cool air source), and a second duct 20 of a second tile 10 may be connected to a second fluid source 110 (e.g., a hot air source). In this manner, the system can be quickly changed between delivering cool and hot air. Alternatively, a two-source system can be used to provide a first fluid (e.g., cool air) to a first area of a room, while simultaneously providing a second different fluid (e.g., hot air) to a second area of the room.

In even further embodiments, arrays of tiles 10 according to aspects of the invention may be used to draw fluid from an area of a room, instead of providing fluid into the room (as described above). For example, the fluid source 110 can provide a relative vacuum compared to the pressure of the room, such that fluid (e.g., air) from the room is drawn into tiles 10. Such configurations can be used, for example, to exhaust hot air out of an area of a data center.

Figure 7:
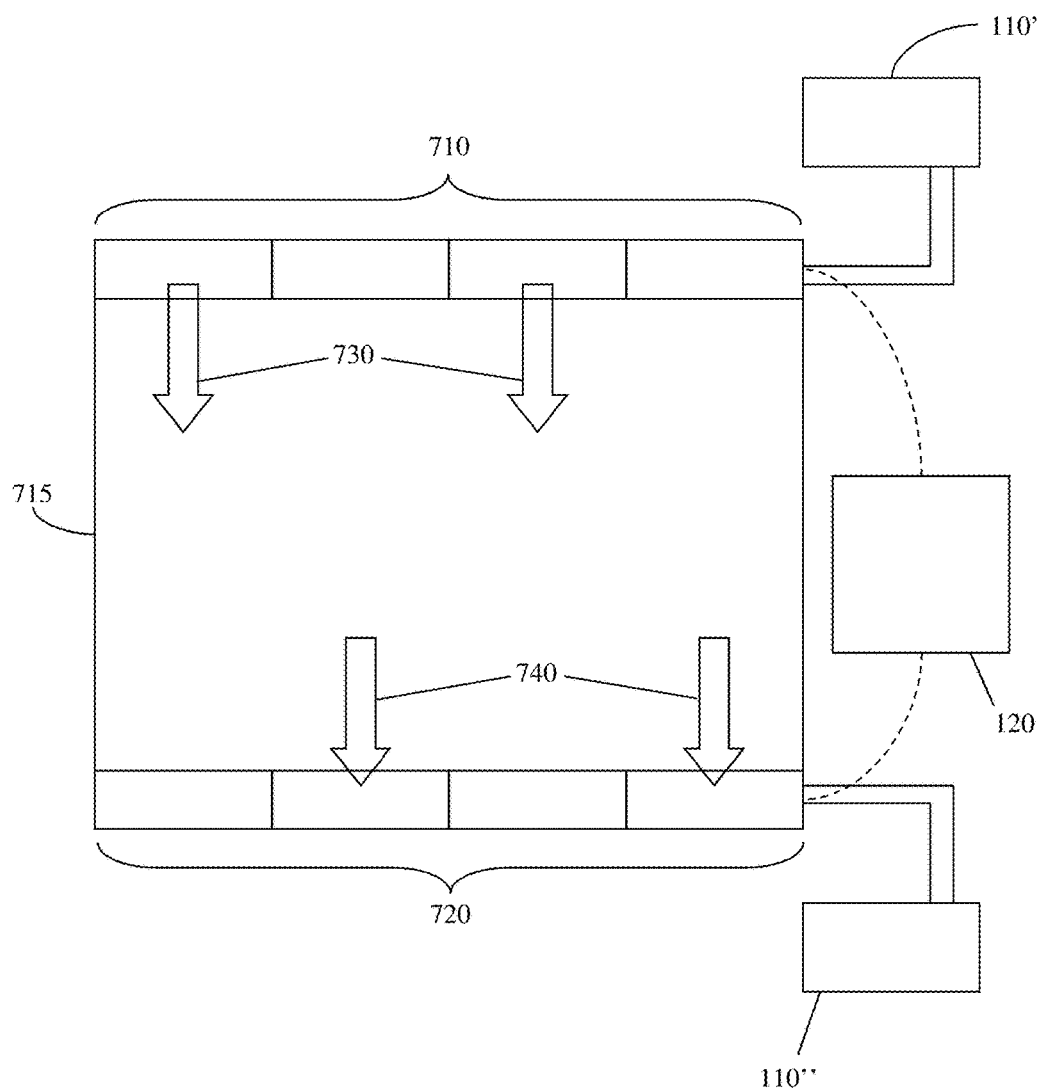
FIG. 7 shows an exemplary system according to aspects of the invention.

FIG. 7 shows a particular embodiment of the invention in which a first array 710 of tiles 10 is arranged at the ceiling of a room 715 (e.g., data center) and a second array 720 of tiles 10 is arranged at the floor of the room. The first array 710 is operatively connected to a first fluid source 110' (e.g., a cool air pump), while the second array 720 is operatively connected to a second fluid source 110" (e.g., an exhaust vacuum). In this manner, cool air from the first fluid source 110' may be selectively introduced into localized area(s) of the room (indicated by arrows 730) by appropriate control of the actuators 35 and port valve actuators 50 of the tiles 10 of the first array 710, while warm air is selectively drawn from localized areas of the room (indicated by arrows 740) via appropriate control of the actuators 35 and port valve actuators 50 of the tiles 10 of the second array 720. As seen in FIG. 7, a single controller 120 may be used to control the actuators 35 and port valve actuators 50 of both arrays 710, 720.

Figure 8:
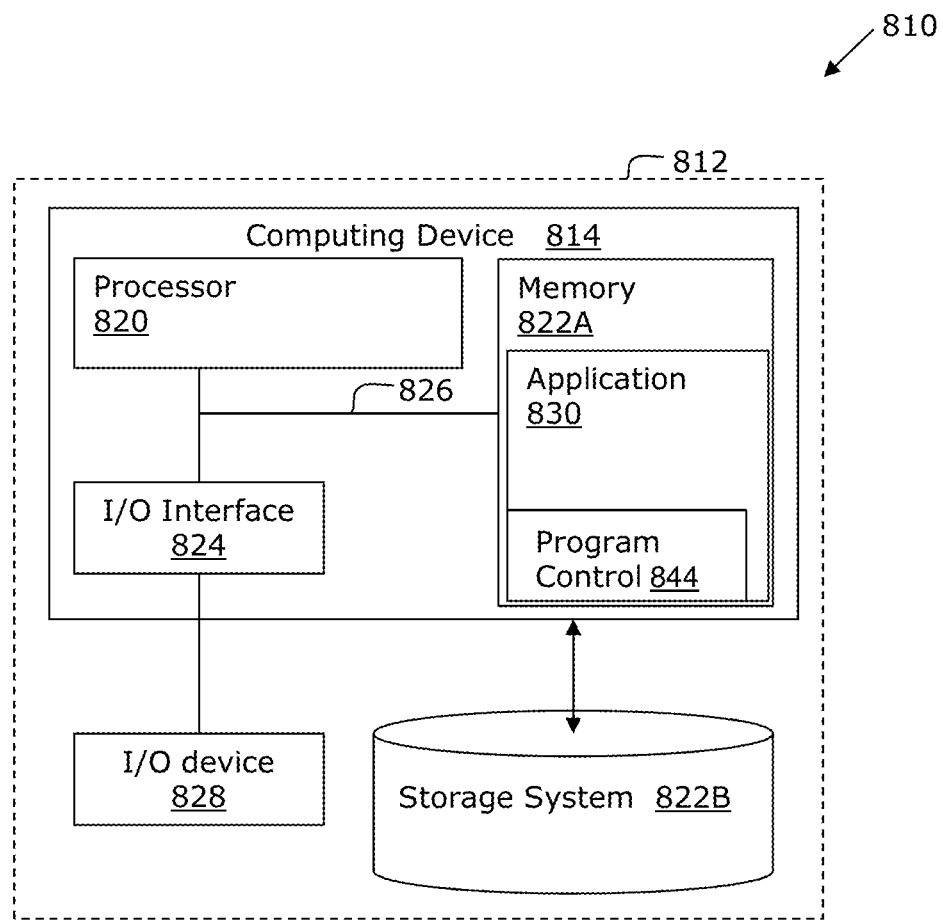
FIG. 8 shows an illustrative environment for implementing the steps in accordance with the invention.

FIG. 8 shows an illustrative environment 810 for managing processes in accordance with the invention. To this extent, the environment 810 includes a computer infrastructure 812 that can perform the processes described herein. For example, the controller 120 (described above) may comprise the computer infrastructure 812. In particular, the computer infrastructure 812 includes a computing device 814 that comprises an application 830 having a program control 844, which makes the computing device 814 operable to perform the processes described herein, such as, for example, providing control signals to actuators of tiles of an array of tiles in which to control temperature according to sensed temperatures or according to predefined temperature profiles.

The computing device 814 includes a processor 820, a memory 822A, an input/output (I/O) interface 824, and a bus 826. The memory 822A can include local memory employed during actual execution of program code, bulk storage, and cache memories which provide temporary storage of at least some program code (e.g., program control 844) in order to reduce the number of times code must be retrieved from bulk storage during execution. Further, the computing device 814 is in communication with an external I/O device/resource 828 and a storage system 822B. The I/O device 828 can comprise any device that enables an individual to interact with the computing device 814 or any device that enables the computing device 814 to communicate with one or more other computing devices using any type of communications link. The external I/O device/resource 828 may be keyboards, displays, pointing devices, etc., which enable a user to adjust or control the climate.

The processor 820 executes computer program code (e.g., program control 844), which is stored in memory 822A and/or storage system 822B. While executing computer program code, the processor 820 can read and/or write data to/from memory 822A, storage system 822B, and/or I/O interface 824. The bus 826 provides a communications link between each of the components in the computing device 814.

The computing device 814 can comprise any general purpose computing article of manufacture capable of executing computer program code installed thereon (e.g., a personal computer, server, wireless notebook, smart phone, personal digital assistant, etc.). However, it is understood that the computing device 814 is only representative of various possible equivalent computing devices that may perform the processes described herein. To this extent, in embodiments, the functionality provided by the computing device 814 can be implemented by a computing article of manufacture that includes any combination of general and/or specific purpose hardware and/or computer program code.

In each embodiment, the program code and hardware can be created using standard programming and engineering techniques, respectively.

Similarly, the computer infrastructure 812 is only illustrative of various types of computer infrastructures for implementing the invention. For example, in embodiments, the computer infrastructure 812 comprises two or more computing devices (e.g., a server cluster) that communicate over any type of communications link, such as a network, a shared memory, or the like, to perform the processes described herein. Further, while performing the processes described herein, one or more computing devices in the computer infrastructure 812 can communicate with one or more other computing devices external to computer infrastructure 812 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

The steps of the flow diagram described herein may be implemented in the environment of FIGS. 4-8. The flow diagram may equally represent a high-level block diagram of the invention. The steps of the flow diagram may be implemented and executed from a server, in a client-server relationship, by computing devices in an ad hoc network, or they may run on a user workstation with operative information conveyed to the user workstation. Additionally, the invention can take the form of an entirely hardware embodiment, an entirely software embodiment or an embodiment containing both hardware and software elements. In an embodiment, the software elements include firmware, resident software, microcode, etc.

Furthermore, the invention can take the form of a computer program product accessible from a computer-usable or computer-readable medium providing program code for use by or in connection with a computer or any instruction execution system. The software and/or computer program product can be implemented in the environments of FIGS. 4-8. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Figure 9:
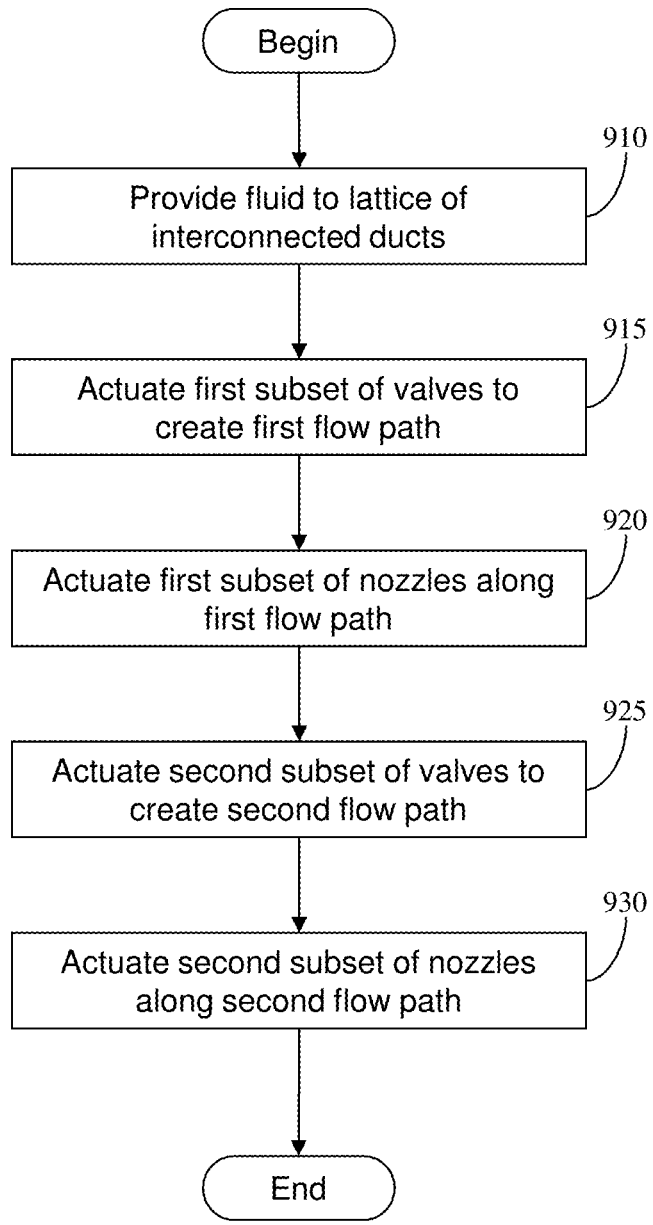
FIG. 9 shows a flow diagram depicting implementations of a method according to aspects of the invention.

FIG. 9 shows a flow diagram depicting steps of a method for providing air to a room in accordance with aspects of the invention. At step 910, fluid is provided to a lattice of interconnected ducts. The lattice may be part of an array of tiles, such as that shown in FIG. 5. The fluid may be provided by connecting at least one duct of at least one tile of the array to a fluid source, such as an HVAC unit. A controller may be operatively connected to the actuators and port valve actuators of the lattice.

At step 915, the controller actuates a first subset of a plurality of valves in the lattice to create a first flow path of the fluid through the lattice. This may be accomplished, for example, as described above with respect to FIGS. 5 and 6.

More specifically, the controller may transmit actuation signals to appropriate ones of the actuators in the lattice to selectively open and close individual ducts within the lattice, thereby creating a flow path within the lattice based on sensed temperatures and/or predefined heating/cooling plans.

At step 920, the controller actuates a first subset of a plurality of nozzles along the first flow path to deliver the fluid to a first localized area of a room. This may be accomplished, for example, as described above with respect to FIGS. 5 and 6. More specifically, the controller may transmit actuation signals to appropriate ones of the port valve actuators to selectively open and close individual port valves along the flow path, thereby allowing fluid to flow out of the lattice, through the open port valve(s), into an adjacent room.

At step 925, the controller actuates a second subset of the plurality of valves in the lattice to create a second flow path of the fluid through the lattice. This may be accomplished similar to step 915, except that the second subset of the plurality of valves may be different than the first subset of the plurality of valves. There may or may not be overlap between the first and second subsets of the plurality of valves, depending upon the desired first and second flow paths.

At step 930, the controller actuates a second subset of the plurality of nozzles along the second flow path to deliver the fluid to a second localized area of the room. This may be accomplished similar to step 920, except that the second subset of the plurality of nozzles may be different than the first subset of the plurality of nozzles. There may or may not be overlap between the first and second subsets of the plurality of nozzles, depending upon the desired air flow requirements into the room.

In embodiments, the room comprises a data center, the localized area comprises a hot spot, and the fluid comprises cold air for cooling the localized area. Moreover, the second flow path may be different than the first flow path. However, the invention is not limited to use with data centers, but rather can be used to provide localized fluid flow (e.g., air flow) into any desired area. For example, implementations of the invention could be used to provide localized air conditioning and/or heating to residential homes, conference centers, hotels, office buildings, stables, etc. Moreover, the invention is not limited to use with air; instead, any suitable fluid may be used within the scope of the invention. For example, implementations of the invention could be used to provide localized fire suppression by delivering water and/or halon gas through the lattice and port valves.

In embodiments, the invention provides a business method that performs the steps of the invention on a subscription, advertising, and/or fee basis. That is, a service provider, such as a Solution Integrator or providing entity, could offer to perform the processes described herein. In this case, the service provider can create, maintain, deploy, support, etc., a computer infrastructure that performs the process steps of the invention for one or more customers. In return, the service provider can receive payment from the customer(s) under a subscription and/or fee agreement and/or the service provider can receive payment from the sale of advertising content to one or more third parties.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A tile assembly adapted to selectively distribute air from a fluid source, comprising:
   a first tile including a first electrical connector that directly connects with a second electrical connector of a second tile at an interface of edges of the first tile and the second tile, wherein the first tile is configured to communicate with the second tile via the first electrical connector;
   a plurality of fluid ducts;
   a central fluid manifold on the first tile connecting the plurality of fluid ducts, wherein one of the plurality of fluid ducts is configured to supply air from the fluid source to the central fluid manifold for distribution to others of the plurality of fluid ducts; and
   an actuator that selectively places the plurality of fluid ducts in fluid communication with the central fluid manifold,
   wherein each of the plurality of fluid ducts extends longitudinally along an outer surface of the first tile between the central fluid manifold and an edge of the first tile.

2. The tile assembly of claim 1, wherein the first tile is substantially planar and rectangular.

3. The tile assembly of claim 1, wherein the central fluid manifold is connected to each one of the plurality of fluid ducts.

4. The tile assembly of claim 1, wherein the actuator is configured to selectively actuate a plurality of valves on the tile to control the flow of fluid from the fluid source to the central fluid manifold.

5. The tile assembly of claim 4, wherein each of the respective valves is structured and arranged to allow, in an open position, and substantially prevent, in a closed position, fluid flow to the central fluid manifold.

6. The tile assembly of claim 4, wherein the valves are located at a respective interface of one of the plurality of fluid ducts and the central fluid manifold.

7. The tile assembly of claim 1, wherein the first tile is a floor, ceiling or wall tile.

8. The tile assembly of claim 1, further comprising a port configured to selectively enable fluid communication between an interior of the central fluid manifold and an opening in an outer wall of the first tile.

9. The tile assembly of claim 8, further comprising a port valve adapted to selectively open and close to control the flow of air from the central fluid manifold to the port, wherein the central fluid manifold is directly connected to the port.

10. The tile assembly of claim 1, wherein the actuator comprises an electric actuator.

11. The tile assembly of claim 1, wherein the first tile is one of a plurality of tiles that are arranged in an array to form a ceiling of a room.

12. The tile assembly of claim 1, wherein the first tile is configured to be arranged with a plurality of other tiles to form a ceiling of a room.

13. The tile assembly of claim 1, wherein the first tile is identical to the second tile.

14. The tile assembly of claim 1, wherein the tile assembly is configured to be arranged with a plurality of other tile assemblies to form a ceiling of a room.

15. The tile assembly of claim 14, wherein the tile assembly is configured to receive the air from the fluid source and communicate the air to one of the plurality of other tile assemblies.

16. The tile assembly of claim 1, wherein the first electrical connector is in the form of a male plug and the second electrical connector is in the form of a female plug, wherein the male plug of the first tile is adapted to directly electrically connect with the female plug of the second tile.

17. A tile assembly system adapted to selectively distribute air from a fluid source for controlling airflow into a room, comprising:
a plurality of interconnecting tile assemblies including a first tile assembly receiving air from the fluid source for distribution to others of the plurality of interconnecting tile assemblies, each tile assembly comprising:
a tile;
a plurality of air ducts;
a central fluid manifold on the tile connecting the plurality of air ducts; and
an actuator that selectively places the plurality of air ducts in fluid communication with the central fluid manifold,
wherein each of the plurality of air ducts extends along an outer surface of the tile between the central fluid manifold and a respective one of a plurality of edges of the tile, and wherein one of the plurality of air ducts distributes air to the central fluid manifold to distribute to others of the plurality of air ducts; and
wherein the first tile assembly further comprises a first electrical connector that directly connects with a second electrical connector of another tile of the plurality of interconnecting tile assemblies at an interface of a first edge of the tile of the first tile assembly and a first edge of the other tile of the plurality of interconnecting tile assemblies, wherein the tile of the first tile assembly is configured to communicate with the other tile of the plurality of interconnecting tile assemblies via the first electrical connector.

18. The tile assembly system of claim 17, wherein the first electrical connector is in the form of a male plug and the second electrical connector is in the form of a female plug, and the male plug of the first tile is adapted to directly electrically connect with the female plug of the second tile.

19. A tile assembly system adapted to selectively distribute air from a fluid source for controlling airflow into a room, comprising:
a plurality of tile assemblies, each tile assembly comprising:
a tile;
a plurality of air ducts;
a fluid manifold on the tile connecting the plurality of air ducts; and
an actuator that selectively places the plurality of air ducts in fluid communication with the fluid manifold,
wherein each of the plurality of air ducts extends along an outer surface of the tile between the fluid manifold and a respective one of a plurality of edges of the tile,
wherein the plurality of edges of the tile comprises four edges, and wherein each of the plurality of air ducts extends along the outer surface of the tile between the fluid manifold and a respective one of the four edges of the tile,
wherein a first tile assembly of the plurality of tile assemblies receives air from the fluid source and is configured to supply the air to a second tile assembly of the plurality of tile assemblies via a connection between one of the plurality of air ducts of the first tile assembly and one of the plurality of air ducts of the second tile assembly,
wherein the first tile assembly includes a first tile and a first electrical connector of the first tile that directly connects with a second electrical connector of a second tile of the second tile assembly, wherein the first tile is configured to communicate with the second tile via the first electrical connector, and
wherein the first electrical connector is in the form of a male plug and the second electrical connector is in the form of a female plug, and the male plug of the first tile is adapted to directly electrically connect with the female plug of the second tile.

20. The tile assembly system of claim 19, wherein the first electrical connector directly connects to the second electrical connector at an interface of edges of the first tile and the second tile.

* * * * *